(12) United States Patent
Chang et al.

(10) Patent No.: US 10,720,389 B2
(45) Date of Patent: Jul. 21, 2020

(54) ANTI-FUSE STRUCTURE

(71) Applicant: NANYA TECHNOLOGY CORPORATION, New Taipei (TW)

(72) Inventors: Chih-Ying Chang, New Taipei (TW); Jui-Hsiu Jao, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/802,085

(22) Filed: Nov. 2, 2017

(65) Prior Publication Data

US 2019/0131237 A1    May 2, 2019

(51) Int. Cl.
*H01L 23/525* (2006.01)
(52) U.S. Cl.
CPC ................ *H01L 23/5252* (2013.01)
(58) Field of Classification Search
None
See application file for complete search history.

(56) References Cited

U.S. PATENT DOCUMENTS

| | | |
|---|---|---|
| 2003/0201514 A1 | 10/2003 | Radens et al. |
| 2004/0227209 A1 | 11/2004 | Radens et al. |
| 2005/0073023 A1* | 4/2005 | Fifield ................. H01L 23/5252 257/530 |
| 2005/0167728 A1 | 8/2005 | Kothandaraman et al. |
| 2008/0038879 A1 | 2/2008 | Kurjanowicz |
| 2009/0189248 A1* | 7/2009 | Kitamura ............ H01L 23/5252 257/530 |
| 2009/0206381 A1* | 8/2009 | Shin .................... H01L 23/5254 257/300 |
| 2012/0018841 A1 | 1/2012 | Kitamura et al. |

FOREIGN PATENT DOCUMENTS

| | | |
|---|---|---|
| CN | 1864262 A | 11/2006 |
| TW | I463542 B | 12/2014 |

OTHER PUBLICATIONS

Office Action dated Jul. 9, 2019 in U.S. Appl. No. 16/224,252.
Office Action dated Nov. 7, 2019 for U.S. Appl. No. 16/224,252.
Chinese Office Action dated Mar. 3, 2020 in CN Application No. 201810120176.9.

* cited by examiner

*Primary Examiner* — Nishath Yasmeen
(74) *Attorney, Agent, or Firm* — Muncy, Geissler, Olds & Lowe, P.C.

(57) ABSTRACT

An anti-fuse structure includes an active area, a gate electrode over the active area, and a dielectric layer between the active area and the gate electrode. The active area and the gate electrode partially overlap in a vertical projection direction, forming a plurality of channels. One of the gate electrode and the active area includes a plurality of extending portions to form the plurality of channels.

15 Claims, 7 Drawing Sheets

ANTI-FUSE STRUCTURE

TECHNICAL FIELD

The present disclosure relates to an anti-fuse structure, and more particularly, to a gate oxide (GOX) anti-fuse structure with multiple channels.

DISCUSSION OF THE BACKGROUND

In integration circuit fabrication, millions or more of electronic components are integrally formed over a wafer. In some cases, a few of the electronic components in the wafer may fail, and thus cannot function normally. It would be wasteful if the entire wafer or chip were aborted merely due to failure of a few of its electronic components. Accordingly, a repair approach is required to repair the failing electronic components to reduce manufacturing costs.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides an anti-fuse structure. The anti-fuse structure includes an active area, a gate electrode over the active area, and a dielectric layer between the active area and the gate electrode. The active area and the gate electrode partially overlap in a vertical projection direction, forming a plurality of channels.

In some embodiments, each of the plurality of channels is substantially rectangular in shape.

In some embodiments, the plurality of channels are arranged substantially parallel to each other.

In some embodiments, the gate electrode comprises a first portion and a plurality of second portions, the first portion has an edge facing the active area, each of the second portions extends from the edge of the first portion toward the active area, and the second portions at least partially overlap the active area in the vertical projection direction, forming the plurality of channels.

In some embodiments, the edge of the first portion of the gate electrode is separate from the active area.

In some embodiments, the edge of the first portion of the gate electrode overlaps the active area in the vertical projection direction.

In some embodiments, the active area comprises a first portion and a plurality of second portions, the first portion has an edge facing the gate electrode, each of the second portions extends from the edge of the first portion toward the gate electrode, and the second portions at least partially overlap the gate electrode in the vertical projection direction, forming the plurality of channels.

In some embodiments, the edge of the first portion of the active area is separate from the gate electrode.

In some embodiments, the edge of the first portion of the active area overlaps the gate electrode in the vertical projection direction.

In some embodiments, the anti-fuse structure further includes a first signal line electrically connected to the gate electrode, and a second signal line electrically connected to the active area.

One aspect of the present disclosure provides an anti-fuse structure. The anti-fuse structure includes an active area, a gate electrode over the active area, and a dielectric layer between the active area and the gate electrode. The gate electrode includes a first portion and a plurality of second portions, the first portion has an edge facing the active area, each of the second portions extends from the edge of the first portion toward the active area, and the second portions at least partially overlap the active area in a vertical projection direction.

In some embodiments, each of the second portions of the gate electrode is substantially rectangular in shape.

In some embodiments, the plurality of second portions of the gate electrode are arranged substantially parallel to each other.

In some embodiments, the edge of the first portion of the gate electrode is separate from the active area.

In some embodiments, the edge of the first portion of the gate electrode overlaps the active area in the vertical projection direction.

One aspect of the present disclosure provides an anti-fuse structure. The anti-fuse structure includes an active area, a gate electrode over the active area, and a dielectric layer between the active area and the gate electrode. The active area comprises a first portion and a plurality of second portions, the first portion has an edge facing the gate electrode, each of the second portions extends from the edge of the first portion toward the gate electrode, and the second portions at least partially overlap the gate electrode in a vertical projection direction.

In some embodiments, each of the second portions of the active area is substantially rectangular in shape.

In some embodiments, the plurality of second portions of the active area are arranged substantially parallel to each other.

In some embodiments, the edge of the first portion of the active area is separate from the gate electrode.

In some embodiments, the edge of the first portion of the active area overlaps the gate electrode in the vertical projection direction.

In some embodiments of the present disclosure, the multi-channel anti-fuse structure includes a plurality of channels. The multi-channel anti-fuse structure has a longer overlapping perimeter 50P between the gate electrode and the active area, and the longer overlapping perimeter improves breakdown performance. The multi-channel anti-fuse structure with improved breakdown performance occupies reduced area on a chip, and thus saves manufacturing costs.

In contrast, the single-channel anti-fuse structure has a shorter overlapping perimeter between the gate electrode and the active area, which reduces the breakdown performance. To enhance breakdown performance, two or more single-channel anti-fuse structures must be connected together. Accordingly, the single-channel anti-fuse structures occupy greater chip areas, and incur increased manufacturing costs.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

DETAILED DESCRIPTION

Figure 1:
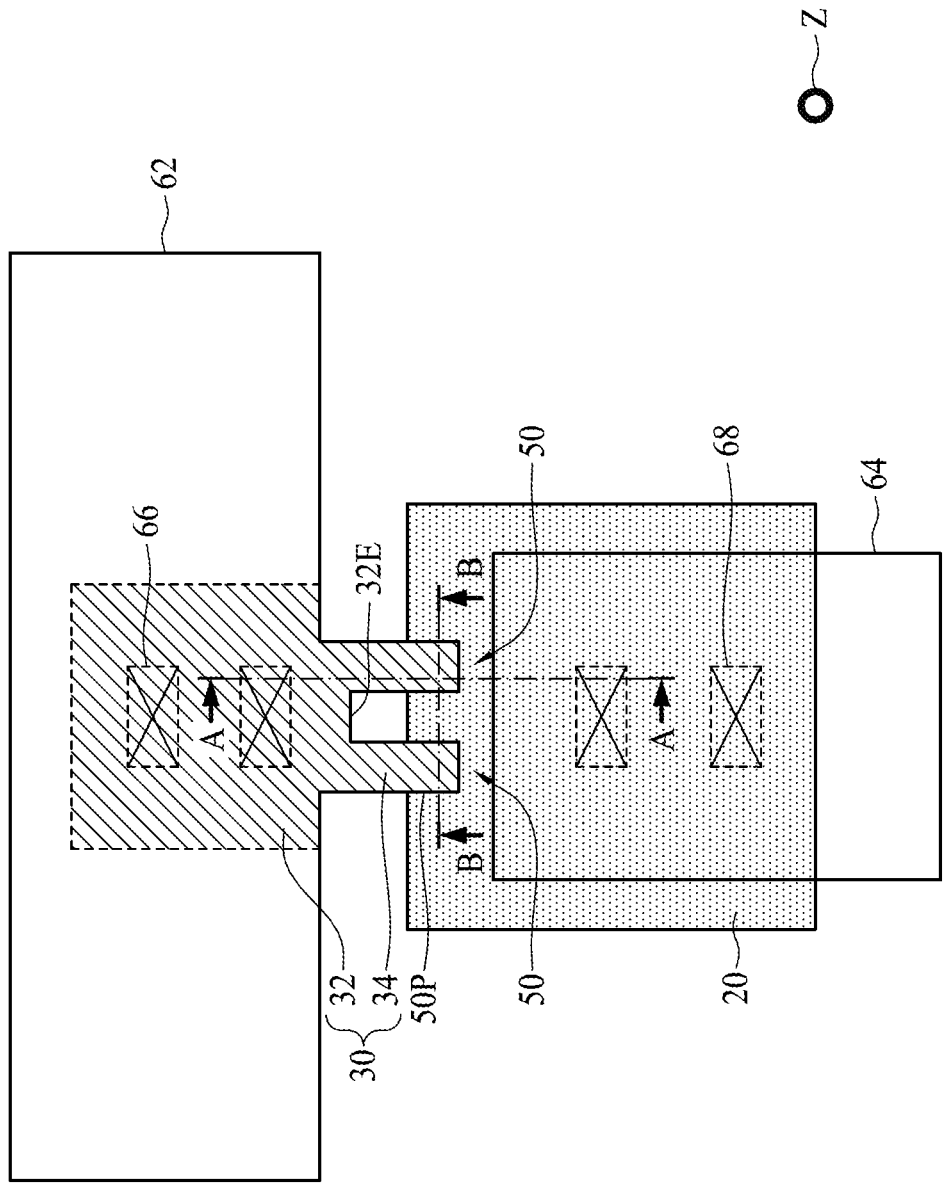
FIG. 1 is a schematic top view illustrating an anti-fuse structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

As used herein, the term "anti-fuse" refers to a semiconductor device which is a normally open circuit. The anti-fuse can be blown to be a short circuit when a programming voltage is applied. In some embodiments of the present disclosure, the anti-fuse structure includes a gate oxide (GOX) anti-fuse structure.

Figure 1A:
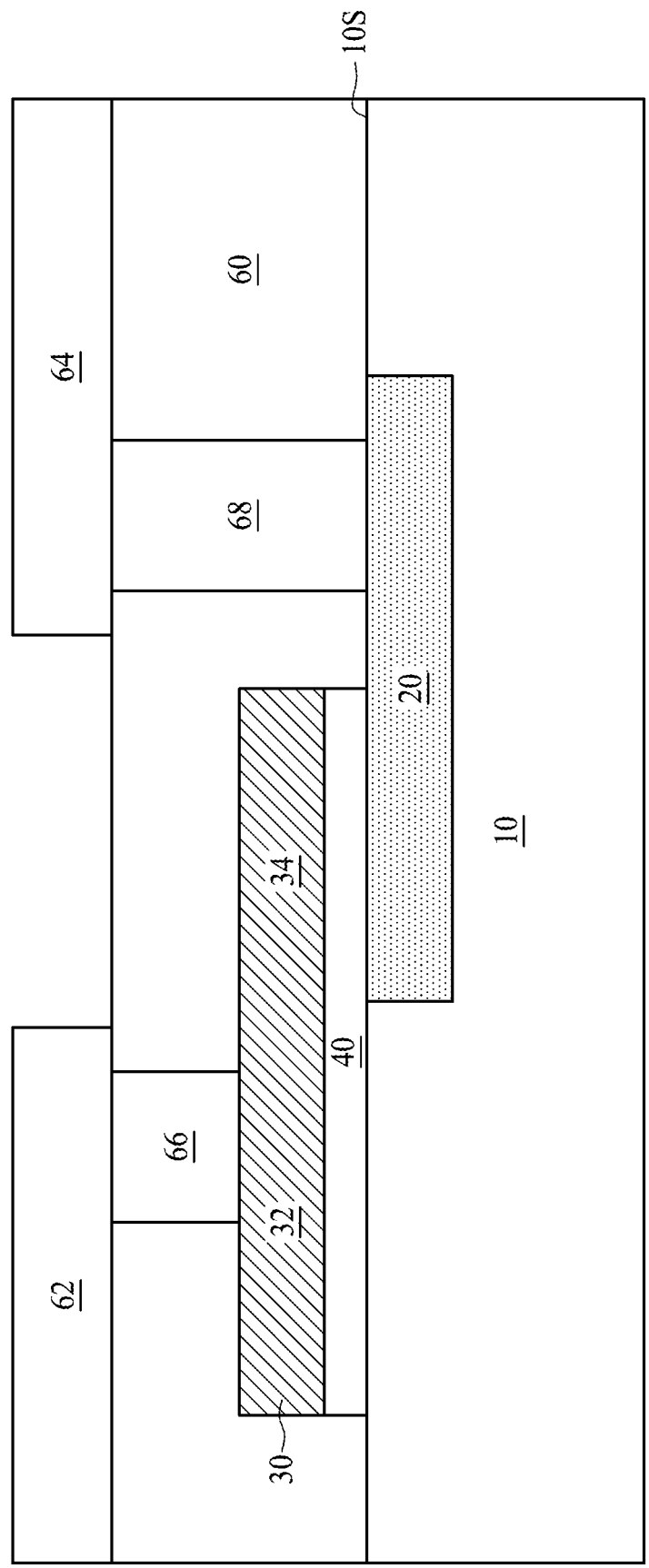
FIG. 1A is a schematic cross-sectional view illustrating an anti-fuse structure along a line A-A of FIG. 1 in accordance with some embodiments of the present disclosure.
Figure 1B:
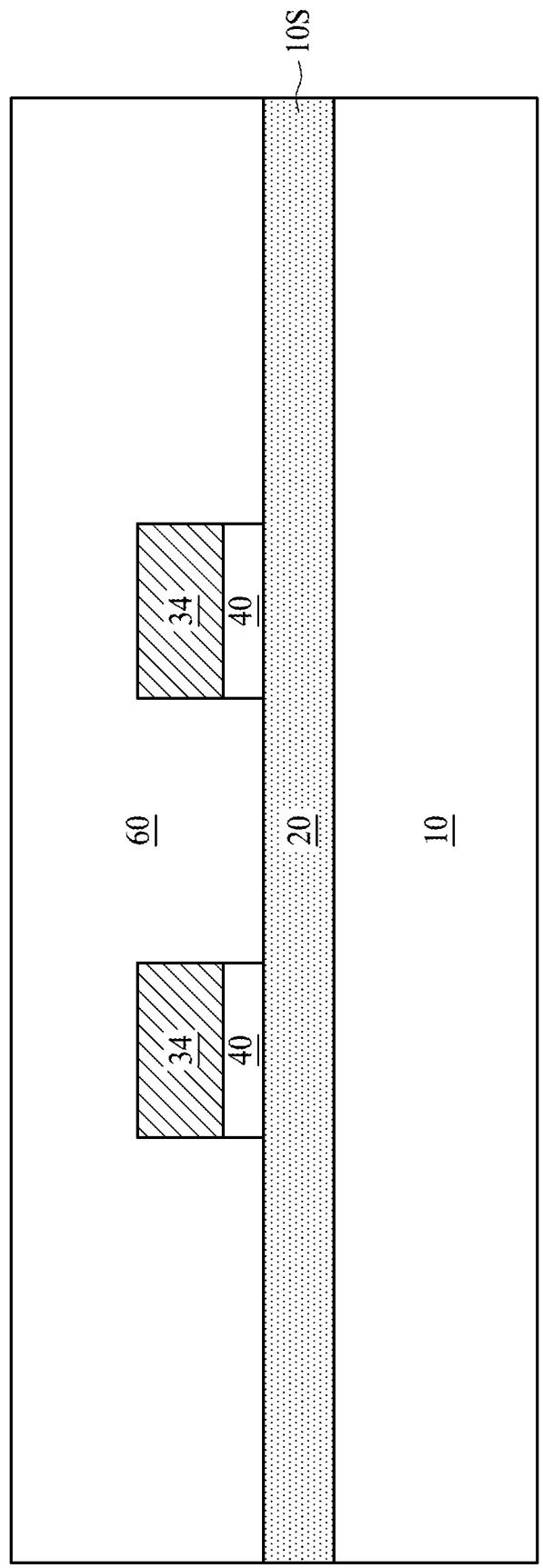
FIG. 1B is a schematic cross-sectional view illustrating an anti-fuse structure along a line B-B of FIG. 1 in accordance with some embodiments of the present disclosure.

FIG. 1 is a schematic top view illustrating an anti-fuse structure in accordance with some embodiments of the present disclosure, FIG. 1A is a schematic cross-sectional view illustrating an anti-fuse structure along a line A-A of FIG. 1 in accordance with some embodiments of the present disclosure, and FIG. 1B is a schematic cross-sectional view illustrating an anti-fuse structure along a line B-B of FIG. 1 in accordance with some embodiments of the present disclosure. As shown in FIG. 1, FIG. 1A and FIG. 1B, the anti-fuse structure 1 includes an active area 20, a gate electrode 30 and a dielectric layer 40 disposed over a semiconductor substrate 10 such as a silicon substrate. The active area 20 may include a doped region. The active area 20 may be formed in the semiconductor substrate 10 and may be proximal to a surface 10S of the semiconductor substrate 10. In some embodiments, the active area 20 may be formed over the surface 10S of the semiconductor substrate 10. The gate electrode 30 is disposed over the active area 20. In some embodiments, the material of the gate electrode 30 may include doped semiconductor material such as doped polycrystalline silicon or the like. In some embodiments, the gate electrode 30 and the active area 20 may include the same dopant type, such as N type or P type. In some embodiments, the gate electrode 30 and the active area 20 may include different dopant types. In some embodiments, the material of the gate electrode 30 may include metal or other suitable conductive material. The dielectric layer 40 is disposed between the active area 20 and the gate electrode 30. In some embodiments, the dielectric layer 40 may include an inorganic dielectric layer such as a silicon oxide layer, but the disclosure is not limited thereto.

The active area 20 and the gate electrode 30 partially overlap in a vertical projection direction Z, and form a plurality of channels 50. The plurality of channels 50 are spaced apart from each other. In some embodiments, the plurality of channels 50 may be equally spaced. In some embodiments, two channels 50 are exemplarily drawn in the figures to illustrate the anti-fuse structure 1 of the present disclosure. The number of the channels 50 is not limited to two, and may be three, four or more. In some embodiments, the shape and the area of the channels 50 may be the same. By way of example, each of the channels 50 may be substantially rectangular in shape, but the disclosure is not limited thereto. In some embodiments, the channels 50 may be arranged substantially parallel to each other, but the disclosure is not limited thereto.

In some embodiments, the pattern of the gate electrode 30 may be configured to implement the plurality of channels 50 of the anti-fuse structure 1. In some embodiments, the gate electrode 30 of the anti-fuse structure 1 may include a first portion 32 and a plurality of second portions 34. The first portion 32 has an edge 32E facing the active area 20. Each of the second portions 34 extends from the edge 32E of the first portion 32 toward the active area 20. The second portions 34 at least partially overlap the active area 20 in the vertical projection direction Z, and form the plurality of channels 50. In some embodiments, the edge 32E of the first portion 32 of the gate electrode 30 is separate from the active area 20. As shown in FIG. 1, the channels 50 of the anti-fuse structure 1 have an overlapping perimeter 50P between the gate electrode 30 and the active area 20.

In some embodiments, the anti-fuse structure 1 may further include an insulative layer 60, a first signal line 62 and a second signal line 64. The insulative layer 60 may cover the active area 20 and the gate electrode 20, and may have a planar surface. The first signal line 62 and the second signal line 64 may be disposed over the insulative layer 60. The first signal line 62 may be electrically connected to the gate electrode 30, for example, via one or more conductive vias 66 through the insulative layer 60. The second signal line 64 may be electrically connected to the active area 20, for example, via one or more conductive vias 68 through the insulative layer 60. In some embodiments, the first signal line 62 and the second signal line 64 are configured to provide a programming voltage across the gate electrode 30 and the active area 20. The anti-fuse structure 1 is a normally open circuit, i.e., the first signal line 62 and the second signal line 64 are electrically disconnected from each other in a normal state. The anti-fuse structure 1 may be blown to be a short circuit when a programming voltage greater than the breakdown voltage is provided between the gate electrode 30 and the active area 20. When the anti-fuse structure 1 is fused, an electrical connection can be made between the first signal line 62 and the second signal line 64. In some embodiments, the anti-fuse structure 1 may be configured as a redundant repair component. By way of example, a memory device may include a plurality of memory cells and redundant cells. When a memory cell is found to malfunction, the anti-fuse structure 1 connected to the malfunctioning memory cell may be fused to remap the memory location from the malfunctioning memory cell to the redundant cell. In some embodiments, the anti-fuse structure 1 may also be configured to customize an integrated circuit after it has been fabricated. By way of example, some anti-fuse structures 1 may be fused to alter the connections in the integrated circuit to meet the requirement of a particular application.

Figure 2:
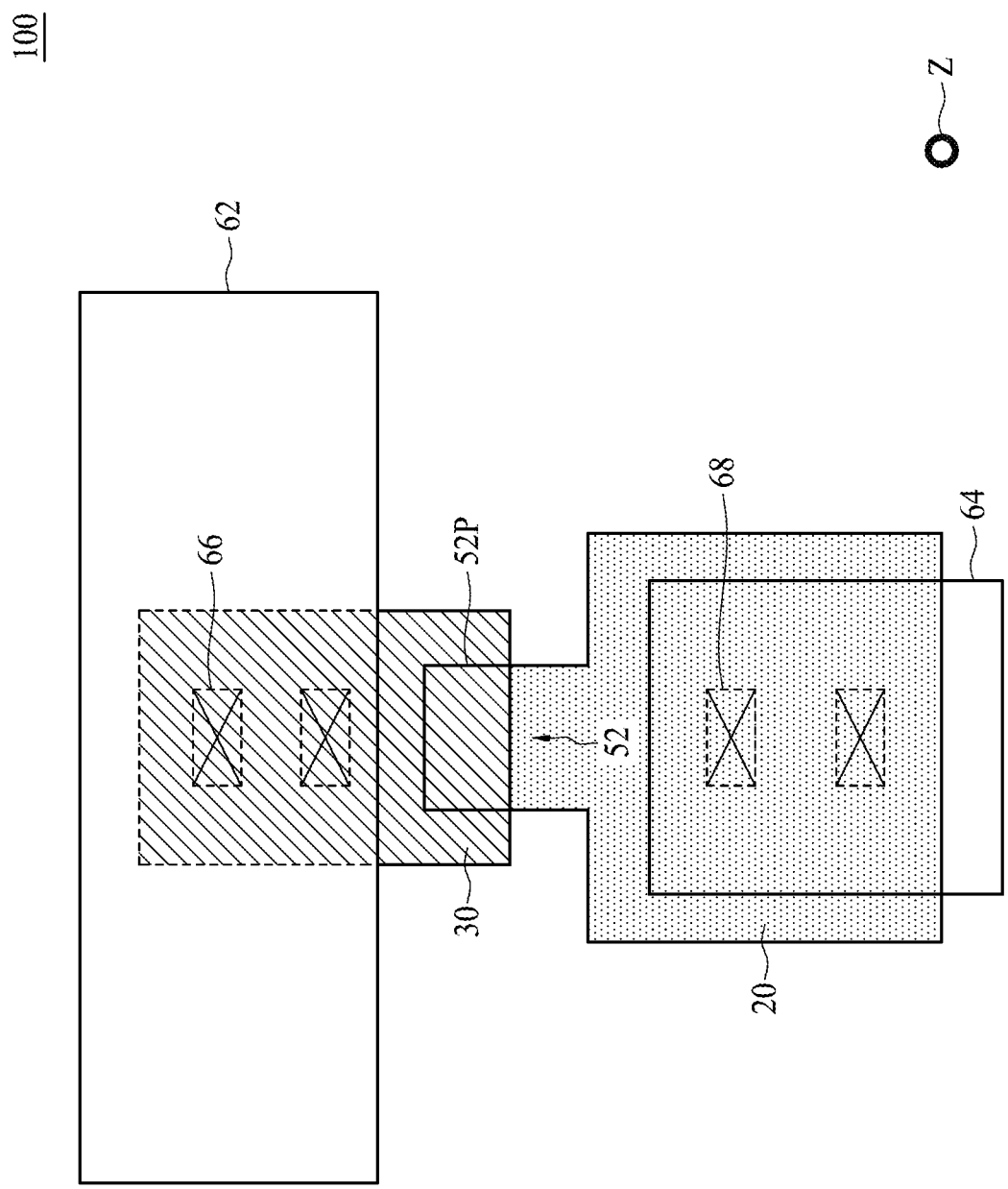
FIG. 2 is a schematic top view illustrating an anti-fuse structure in accordance with a comparative embodiment of the present disclosure.

FIG. 2 is a schematic top view illustrating an anti-fuse structure in accordance with a comparative embodiment of the present disclosure. As shown in FIG. 2, the anti-fuse structure 100 of the comparative embodiment has a single channel 52, and the channel 52 has an overlapping perimeter 52P between the gate electrode 30 and the active area 20.

In contrast to the comparative embodiment in which the anti-fuse structure 100 includes a single channel 52, the anti-fuse structure 1 of the present disclosure with multiple channels 50 has a longer overlapping perimeter 50P. The longer overlapping perimeter 50P can reduce the breakdown voltage, and therefore increases the probability of successful fusing of the anti-fuse structure 1.

In another comparative embodiment, two anti-fuse structures 100 are connected for increasing the probability of successful fusing of the anti-fuse structures. The use of two anti-fuse structures 100 connected together, however, increases area consumption in the integrated circuit.

In contrast to the comparative embodiment in which two single channel anti-fuse structures 100 are connected together, the anti-fuse structure 1 of the present disclosure with multiple channels 50 has greater probability of successful fusing, reduced area consumption in the integrated circuit, and reduced manufacturing costs.

The anti-fuse structure of the present disclosure is not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities between different embodiments and the identical features will not be redundantly described.

Figure 3:
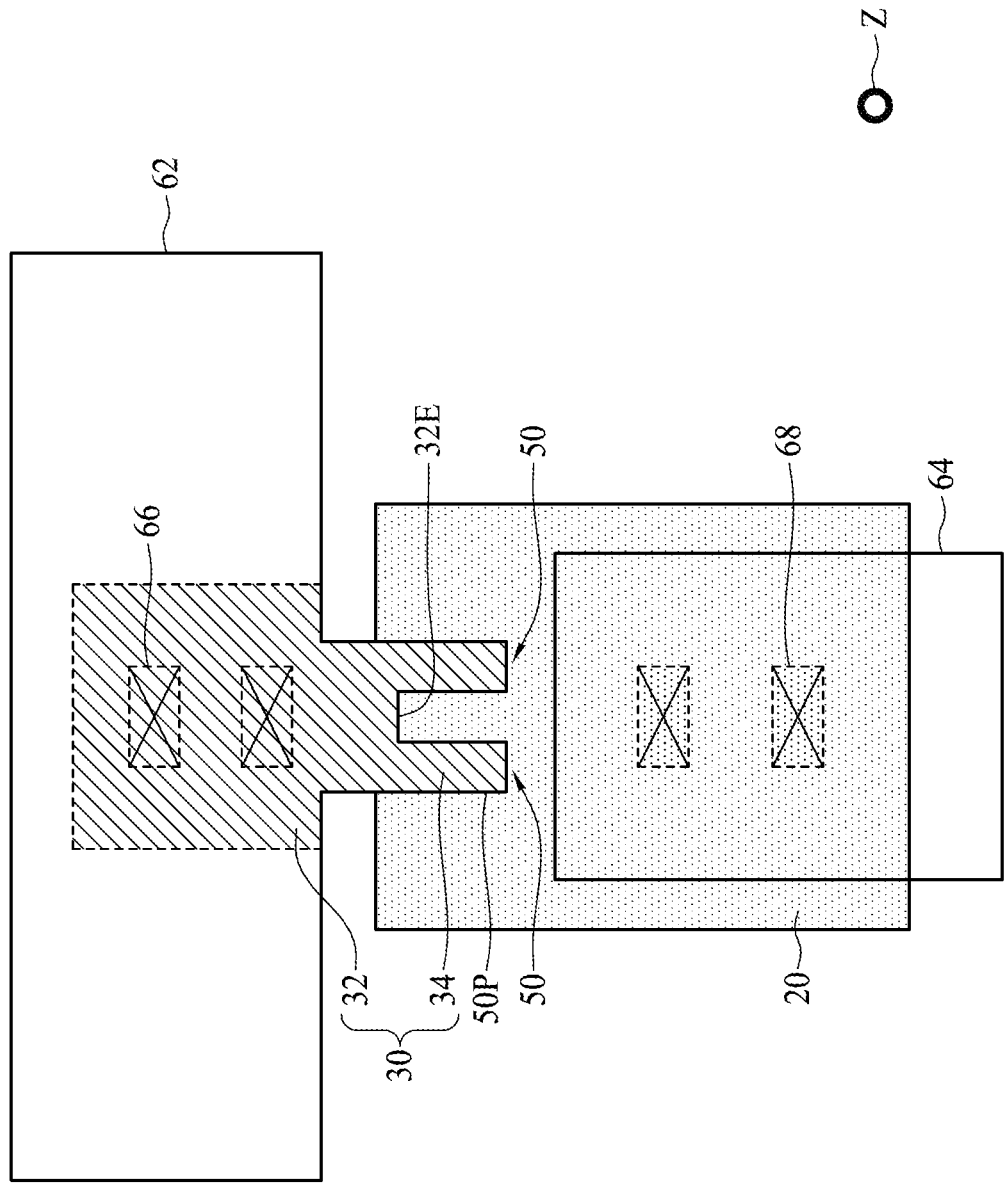
FIG. 3 is a schematic diagram illustrating an anti-fuse structure in accordance with some embodiments of the present disclosure.

FIG. 3 is a schematic diagram illustrating an anti-fuse structure in accordance with some embodiments of the present disclosure. As shown in FIG. 3, in contrast to the anti-fuse structure 1 of FIG. 1, the gate electrode 30 extends farther toward the active area 20 such that the edge 32E of the first portion 32 of the gate electrode 30 overlaps the active area 20 in the vertical projection direction Z. As the overlapping perimeter 50P between the gate electrode 30 and the active area 20 increases, the probability of successful fusing of the anti-fuse structure 2 can be further increased.

Figure 4:
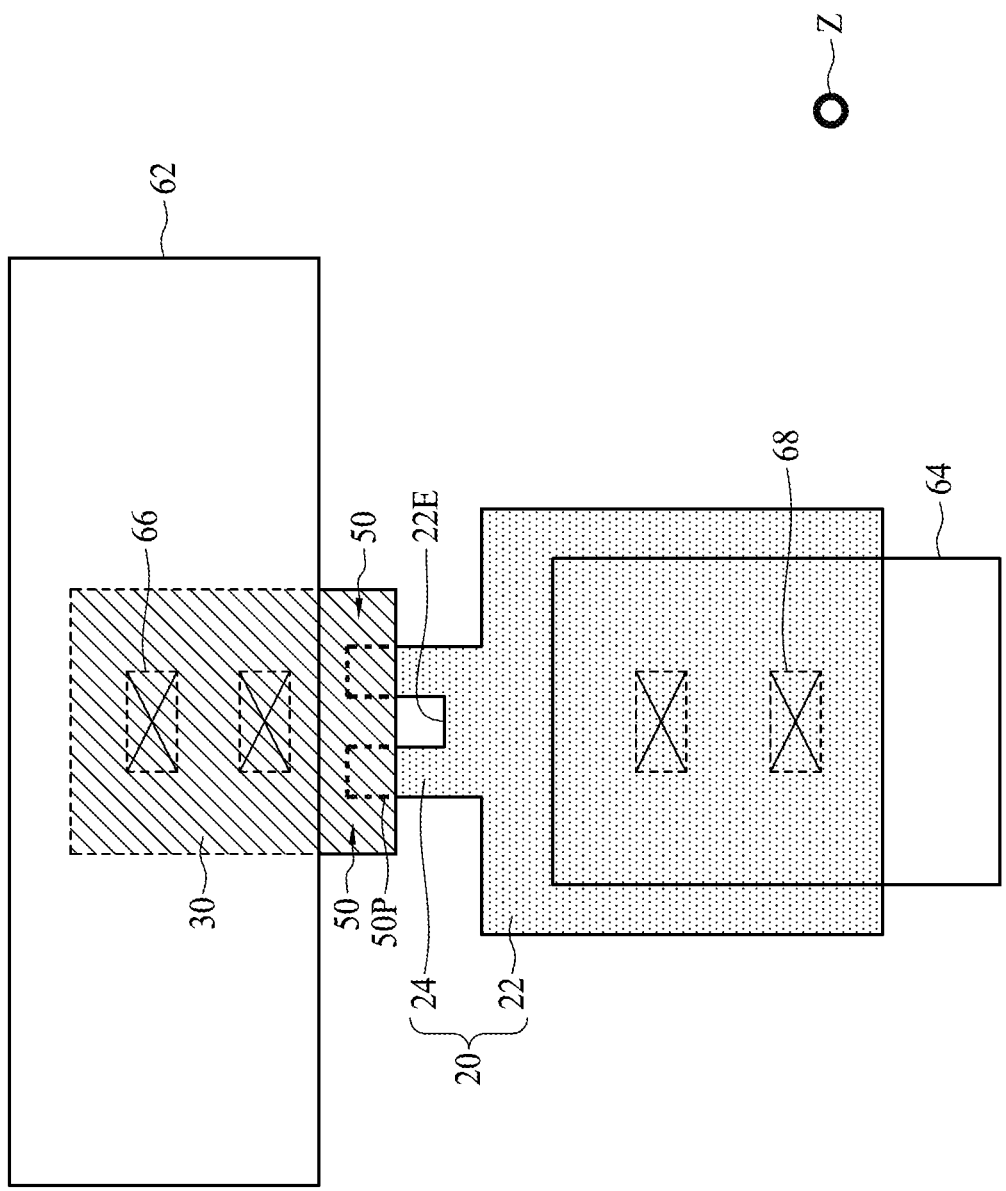
FIG. 4 is a schematic diagram illustrating an anti-fuse structure in accordance with some embodiments of the present disclosure.

FIG. 4 is a schematic diagram illustrating an anti-fuse structure in accordance with some embodiments of the present disclosure. As shown in FIG. 4, in contrast to the anti-fuse structure 1 of FIG. 1, the pattern of the active area 20 is configured to implement the plurality of channels 50 of the anti-fuse structure 3. In some embodiments, the active area 20 of the anti-fuse structure 3 may include a first portion 22 and a plurality of second portions 24. The first portion 22 has an edge 22E facing the gate electrode 30. Each of the second portions 24 extends from the edge 22E of the first portion 22 toward the gate electrode 30. The second portions 24 at least partially overlap the gate electrode 30 in the vertical projection direction Z, and form the plurality of channels 50. In some embodiments, the edge 22E of the first portion 22 of the active area 20 is separate from the gate electrode 30.

The anti-fuse structure 3 of the present disclosure with multiple channels 50 has a longer overlapping perimeter 50P. The longer overlapping perimeter 50P can reduce the breakdown voltage, and therefore increases the probability of successful fusing of the anti-fuse structure 3.

Figure 5:
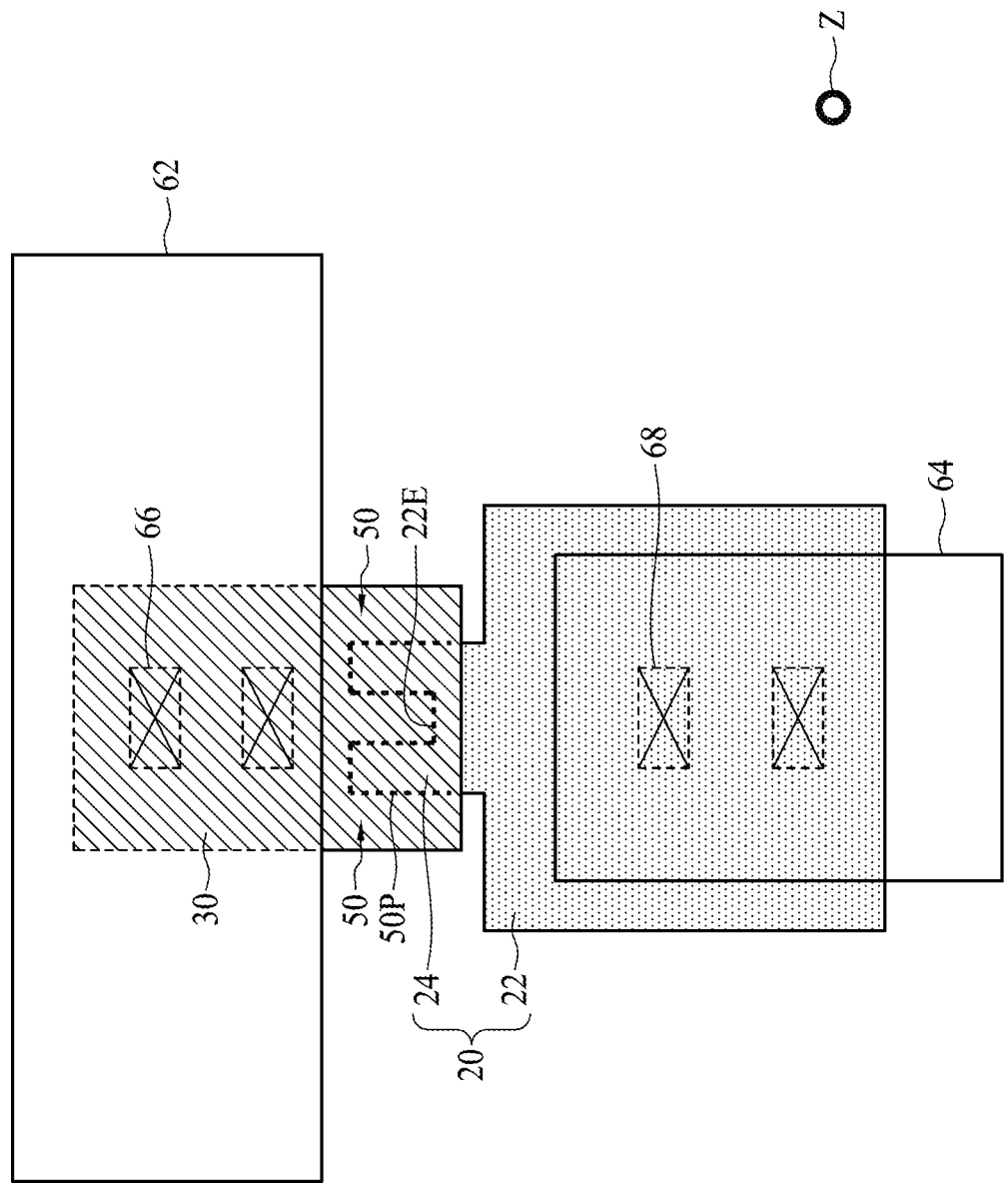
FIG. 5 is a schematic diagram illustrating an anti-fuse structure in accordance with some embodiments of the present disclosure.

FIG. 5 is a schematic diagram illustrating an anti-fuse structure in accordance with some embodiments of the present disclosure. As shown in FIG. 5, in contrast to the anti-fuse structure 3 of FIG. 4, the active area 20 extends farther toward the gate electrode 30 such that the edge 22E of the first portion 22 of the active area 20 overlaps the gate electrode 30 in the vertical projection direction Z. As the overlapping perimeter 50P between the gate electrode 30 and the active area 20 increases, the probability of successful fusing of the anti-fuse structure 4 can be further increased.

In some embodiments of the present disclosure, the multi-channel anti-fuse structure includes a plurality of channels 50. The multi-channel anti-fuse structure has a longer overlapping perimeter 50P between the gate electrode 30 and the active area 20, which improves the breakdown performance. The multi-channel anti-fuse structure with improved breakdown performance occupies reduced area on a chip, and thus saves manufacturing costs.

In contrast, the single-channel anti-fuse structure has a shorter overlapping perimeter between the gate electrode and the active area, which reduces the breakdown performance. To enhance breakdown performance, two or more single-channel anti-fuse structures must be connected together. Accordingly, the area consumption on a chip and manufacturing costs are increased.

One aspect of the present disclosure provides an anti-fuse structure. The anti-fuse structure includes an active area, a gate electrode over the active area, and a dielectric layer between the active area and the gate electrode. The active area and the gate electrode partially overlap in a vertical projection direction, forming a plurality of channels.

One aspect of the present disclosure provides an anti-fuse structure. The anti-fuse structure includes an active area, a gate electrode over the active area, and a dielectric layer between the active area and the gate electrode. The gate electrode includes a first portion and a plurality of second portions, the first portion has an edge facing the active area, each of the second portions extends from the edge of the first portion toward the active area, and the second portions at least partially overlap the active area in a vertical projection direction.

One aspect of the present disclosure provides an anti-fuse structure. The anti-fuse structure includes an active area, a gate electrode over the active area, and a dielectric layer between the active area and the gate electrode. The active area comprises a first portion and a plurality of second portions, the first portion has an edge facing the gate electrode, each of the second portions extends from the edge of the first portion toward the gate electrode, and the second portions at least partially overlap the gate electrode in a vertical projection direction.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An anti-fuse structure, comprising:
a semiconductor substrate:
an active area disposed in the semiconductor substrate; a gate electrode over the semiconductor substrate and the active area; and a dielectric layer, between the active area and the gate electrode, including a top surface directly contacted with an entire bottom surface of the gate electrode and a bottom surface directly contacted with the substrate and the active area, wherein the active area and the gate electrode partially overlap, forming a plurality of channels;
an insulative layer covering the active area and the gate electrode;
a first signal line disposed over the insulative layer and electrically connected to the gate electrode via at least one first conductive via through the insulative layer; and
a second signal line disposed over the insulative layer and electrically connected to the active area via at least one second conductive via through the insulative layer;
wherein the gate electrode has a planar upper surface, and the dielectric layer has a uniform thickness; the gate electrode completely covers the dielectric layer; and
wherein an edge portion of the gate electrode overlaps with the active area to form the channels.

2. The anti-fuse structure of claim 1, wherein each of the plurality of channels is substantially rectangular in shape.

3. The anti-fuse structure of claim 1, wherein the plurality of channels are arranged substantially parallel to each other.

4. The anti-fuse structure of claim 1, wherein the gate electrode comprises a first portion and a plurality of second portions, the first portion has an edge facing the active area, each of the second portions extends from the edge of the first portion toward the active area, and the second portions at least partially overlap the active area, forming the plurality of channels.

5. The anti-fuse structure of claim 4, wherein the edge of the first portion of the gate electrode is separate from the active area.

6. The anti-fuse structure of claim 4, wherein the edge of the first portion of the gate electrode overlaps the active area in the vertical projection direction.

7. The anti-fuse structure of claim 1, wherein the active area comprises a first portion and a plurality of second portions, the first portion has an edge facing the gate electrode, each of the second portions extends from the edge of the first portion toward the gate electrode, and the second portions at least partially overlap the gate electrode in the vertical projection direction, forming the plurality of channels.

8. The anti-fuse structure of claim 7, wherein the edge of the first portion of the active area is separate from the gate electrode.

9. The anti-fuse structure of claim 7, wherein the edge of the first portion of the active area overlaps the gate electrode in the vertical projection direction.

10. The anti-fuse structure of claim 1, wherein the first signal line is electrically connected to the gate electrode, and the second signal line is electrically connected to the active area.

11. An anti-fuse structure, comprising: a semiconductor substrate:
an active area disposed in the semiconductor substrate;
gate electrode over the semiconductor substrate and the active area; and
a dielectric layer, between the active area and the gate electrode, including a ton surface directly contacted with an entire bottom surface of the gate electrode and a bottom surface directly contacted with the substrate and the active area, wherein the gate electrode comprises a first portion and a plurality of second portions, the first portion has an edge facing the active area, each of the second portions extends from the edge of the first portion toward the active area, and distal ends of the second portions that are farthest from the first portion overlap with the active area;
wherein the gate electrode has a planar upper surface, and the dielectric layer has a uniform thickness; the gate electrode completely covers the dielectric layer.

12. The anti-fuse structure of claim 11, wherein each of the second portions of the gate electrode is substantially rectangular in shape.

13. The anti-fuse structure of claim 11, wherein the plurality of second portions of the gate electrode are arranged substantially parallel to each other.

14. The anti-fuse structure of claim 11, wherein the edge of the first portion of the gate electrode is separate from the active area.

15. The anti-fuse structure of claim 11, wherein the edge of the first portion of the gate electrode overlaps the active area in the vertical projection direction.

* * * * *